(12) United States Patent
Xie et al.

(10) Patent No.: US 8,936,979 B2
(45) Date of Patent: Jan. 20, 2015

(54) SEMICONDUCTOR DEVICES HAVING IMPROVED GATE HEIGHT UNIFORMITY AND METHODS FOR FABRICATING SAME

(75) Inventors: Ruilong Xie, Albany, NY (US); Xiuyu Cai, Albany, NY (US); Andy C. Wei, Queensbury, NY (US); Robert Miller, Yorktown Heights, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 174 days.

(21) Appl. No.: 13/493,865

(22) Filed: Jun. 11, 2012

(65) Prior Publication Data
US 2013/0328112 A1 Dec. 12, 2013

(51) Int. Cl.
H01L 21/00 (2006.01)

(52) U.S. Cl.
USPC ............... 438/197; 438/142; 257/E21.001

(58) Field of Classification Search
None
See application file for complete search history.

(56) References Cited

U.S. PATENT DOCUMENTS

| | | | |
|---|---|---|---|
| 7,723,192 B2 * | 5/2010 | Carter et al. | 438/275 |
| 8,258,062 B2 * | 9/2012 | Richter et al. | 438/689 |
| 8,358,012 B2 * | 1/2013 | Haran et al. | 257/774 |
| 8,367,495 B2 * | 2/2013 | Beyer et al. | 438/216 |
| 8,383,500 B2 * | 2/2013 | Marxsen et al. | 438/585 |
| 8,426,300 B2 * | 4/2013 | Ramachandran et al. | 438/586 |
| 8,487,354 B2 * | 7/2013 | Chen et al. | 257/288 |
| 8,629,511 B2 * | 1/2014 | Koburger et al. | 257/392 |
| 2010/0059833 A1 * | 3/2010 | Yu et al. | 257/410 |
| 2011/0147853 A1 * | 6/2011 | Lin et al. | 257/379 |
| 2011/0244670 A1 * | 10/2011 | Richter et al. | 438/585 |
| 2012/0001263 A1 * | 1/2012 | Richter et al. | 257/368 |
| 2012/0122283 A1 * | 5/2012 | Lee et al. | 438/287 |
| 2012/0211838 A1 * | 8/2012 | Kronholz et al. | 257/369 |
| 2012/0223388 A1 * | 9/2012 | Feustel et al. | 257/368 |
| 2012/0306026 A1 * | 12/2012 | Guo et al. | 257/407 |
| 2013/0075821 A1 * | 3/2013 | Baars et al. | 257/368 |
| 2013/0113027 A1 * | 5/2013 | Chiang et al. | 257/288 |
| 2013/0178024 A1 * | 7/2013 | Flachowsky et al. | 438/199 |
| 2013/0189833 A1 * | 7/2013 | Baars et al. | 438/586 |
| 2013/0234216 A1 * | 9/2013 | Chou et al. | 257/288 |
| 2013/0270628 A1 * | 10/2013 | Huang et al. | 257/329 |

FOREIGN PATENT DOCUMENTS

| | | |
|---|---|---|
| TW | 201009959 A | 3/2010 |
| TW | 201011837 A | 3/2010 |
| TW | 201123448 A | 7/2011 |
| TW | 201203383 A | 1/2012 |
| TW | 201212231 A | 3/2012 |

OTHER PUBLICATIONS

Intellectual Property Office, Examination Report for Taiwanese Patent Application No. 101137887 mailed Aug. 26, 2014.

* cited by examiner

Primary Examiner — Scott B Geyer
Assistant Examiner — Evren Seven
(74) Attorney, Agent, or Firm — Ingrassia Fisher & Lorenz, P.C.

(57) ABSTRACT

Semiconductor devices and methods for fabricating semiconductor devices are provided. In an embodiment, a method for fabricating a semiconductor device includes forming on a semiconductor surface a temporary gate structure including a polysilicon gate and a cap. A spacer is formed around the temporary gate structure. The cap and a portion of the spacer are removed. A uniform liner is deposited overlying the polysilicon gate. The method removes a portion of the uniform liner overlying the polysilicon gate and the polysilicon gate to form a gate trench. Then, a replacement metal gate is formed in the gate trench.

17 Claims, 9 Drawing Sheets

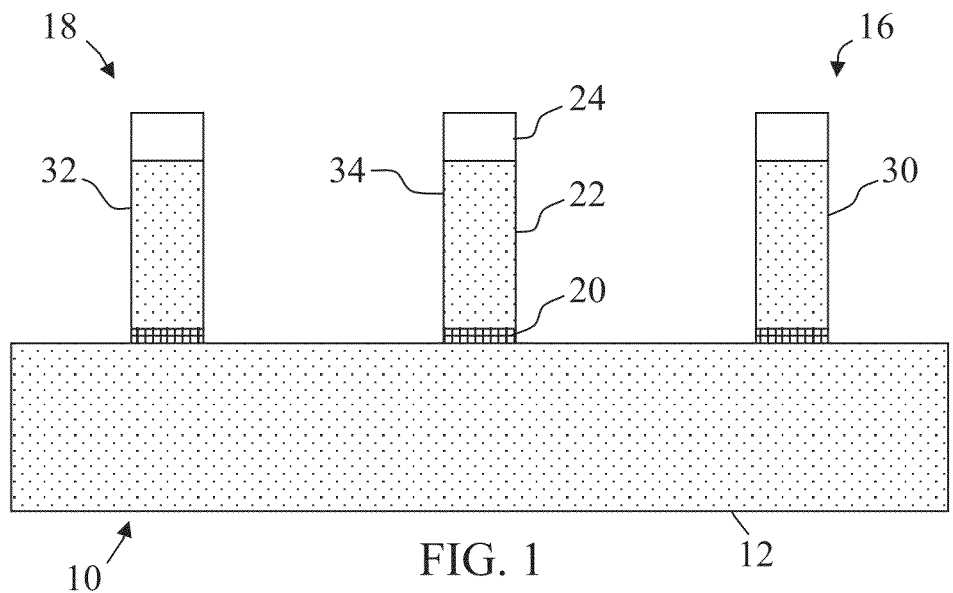
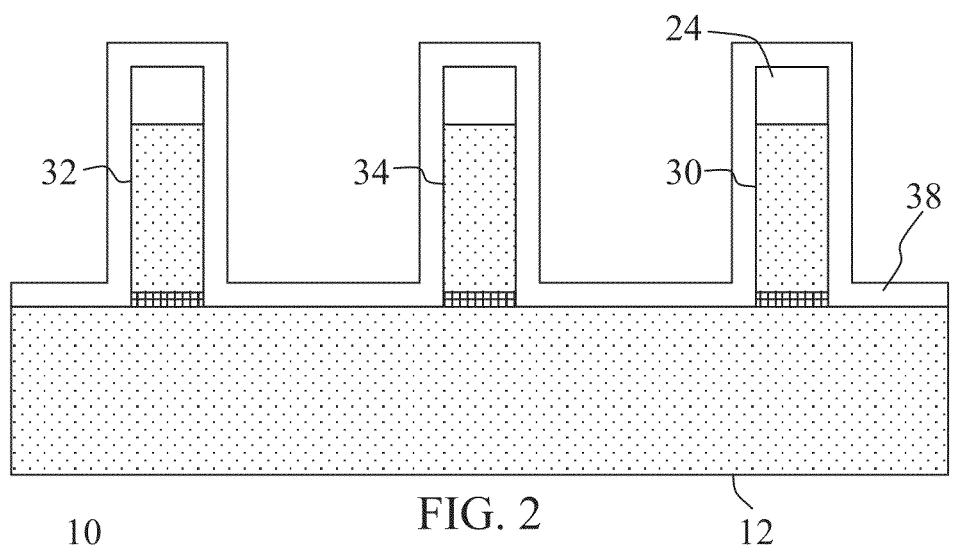

SEMICONDUCTOR DEVICES HAVING IMPROVED GATE HEIGHT UNIFORMITY AND METHODS FOR FABRICATING SAME

TECHNICAL FIELD

The present disclosure generally relates to semiconductor devices and methods for fabricating semiconductor devices, and more particularly relates to semiconductor devices having improved gate height uniformity and methods for fabricating semiconductor devices having improved gate height uniformity

BACKGROUND

As technology nodes shrink, in some integrated circuit designs there has been a desire to eliminate use of polysilicon gate electrodes to improve device performance with decreased feature sizes. Replacing polysilicon gate structures with metal gate structures is one solution. Replacement metal gate structures can provide superior $T_{inv}$ (inversion layer thickness)–$V_t$ (threshold voltage) performance. However, in conventional fabrication methods it is difficult to control replacement metal gate structure heights. Specifically, multiple spacer etching and source/drain pre epi clean processes result in thickness variation for the hardmasks covering temporary polysilicon gate electrodes. Conventionally, these hardmasks are used as stops for planarization processes during replacement metal gate preparation. Therefore, variability in hardmask thickness leads to variability in replacement metal gate structure height. It is desirable to eliminate variability in replacement metal gate structure height to improve device performance.

Further, as gate pitches decrease, the parasitic capacitance component between gates and contact plugs becomes increasingly significant. Therefore, it is desirable to implement a lower K dielectric between the gates and contacts to reduce capacitance.

Accordingly, it is desirable to provide semiconductor devices having metal gate structures with a uniform height and methods for fabricating semiconductor devices having metal gate structures with a uniform height. In addition, it is desirable to provide semiconductor devices and methods for fabricating semiconductor devices with reduced parasitic capacitance. Furthermore, other desirable features and characteristics will become apparent from the subsequent detailed description and the appended claims, taken in conjunction with the accompanying drawings and the foregoing technical field and background.

BRIEF SUMMARY

Semiconductor devices and methods for fabricating semiconductor devices are provided. In accordance with one embodiment, a method for fabricating a semiconductor device includes forming on a semiconductor surface a temporary gate structure including a polysilicon gate and a cap. A spacer is formed around the temporary gate structure. The cap and a portion of the spacer are removed. A uniform liner is deposited overlying the polysilicon gate. The method removes a portion of the uniform liner overlying the polysilicon gate and the polysilicon gate to form a gate trench. Then, a replacement metal gate is formed in the gate trench.

In another embodiment, a method for fabricating a semiconductor device is provided and includes forming temporary gate structures on a semiconductor surface. The method further includes forming active areas around the temporary gate structures. Material overlying and adjacent the temporary gate structures is removed to expose the temporary gate structures. Then, a uniform liner is deposited overlying the temporary gate structures. An insulator material is deposited over the uniform liner. The insulator material is planarized to the uniform liner to expose portions of the uniform liner overlying the temporary gate structures. The exposed portions of the uniform liner and the temporary gate structures are removed to form gate trenches. Then, replacement metal gates are formed in the gate trenches.

In accordance with another embodiment, a semiconductor device is provided and includes a semiconductor substrate and replacement metal gate structures formed on the semiconductor substrate. The replacement metal gate structures have a uniform height and side surfaces. Spacers are located adjacent the side surfaces of the replacement metal gate structures. Each spacer includes a top portion and a bottom portion. Each top portion is formed by a uniform nitride liner and has a top thickness, and each bottom portion has a bottom thickness greater than the top thickness.

BRIEF DESCRIPTION OF THE DRAWINGS

Embodiments of the semiconductor devices having improved replacement metal gate structure height uniformity and methods for fabricating such semiconductor devices will hereinafter be described in conjunction with the following drawing figures, wherein like numerals denote like elements, and wherein:

FIGS. 1-17 illustrate, in cross section, a portion of a semiconductor device and method steps for fabricating a semiconductor device in accordance with various embodiments herein.

DETAILED DESCRIPTION

Figure 3:
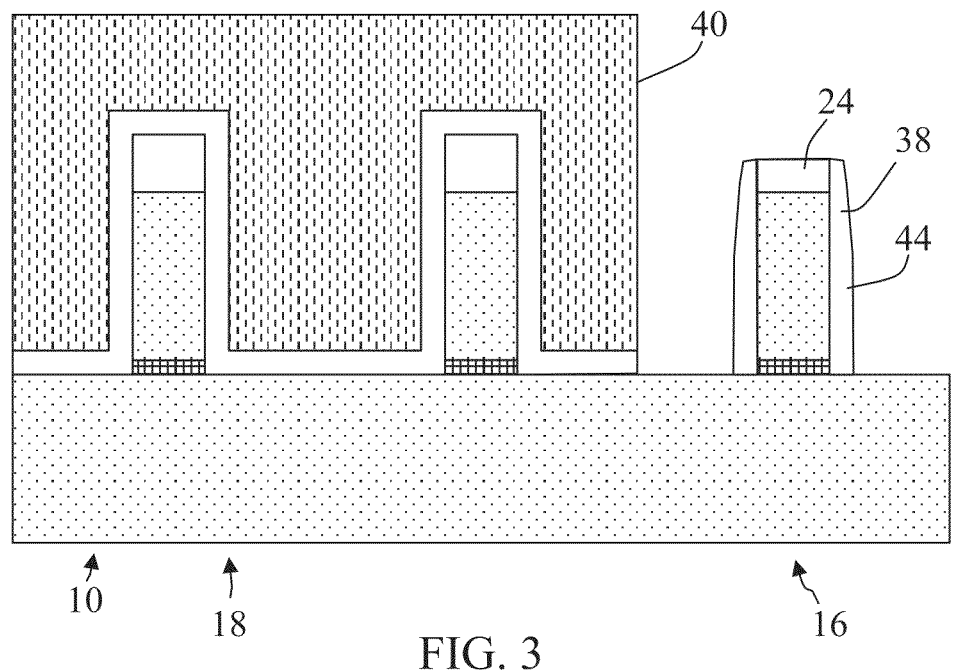

The following detailed description is merely exemplary in nature and is not intended to limit the semiconductor devices or the methods for fabricating semiconductor devices as claimed herein. Furthermore, there is no intention to be bound by any expressed or implied theory presented in the preceding technical field, background or brief summary, or in the following detailed description.

In accordance with the various embodiments herein, semiconductor devices having replacement metal gate structures with improved gate height uniformity and methods for fabricating semiconductor devices with improved gate height uniformity are provided. In an exemplary embodiment, the methods for fabricating semiconductor devices include removing hard mask layers, including liners and caps, from temporary gate structures to expose polysilicon gates. In conventional methods, the hard mask layers exhibit variable thicknesses after undergoing various etching processes. Herein, a uniform liner is deposited over the polysilicon gates after removal of the variable hard mask layers. Subsequent planarization steps use the uniform liner as a stop. Because the uniform liner does not endure etching processes before planarization, it retains its substantially uniform thickness. As a result, planarization to the uniform liner and subsequent etching result in gate trenches having a substantially constant depth and, subsequently, replacement metal gate structures formed in the gate trenches have a substantially uniform height.

FIGS. 1-17 illustrate sequentially a method for fabricating semiconductor devices with replacement metal gate structures having uniform heights in accordance with various embodiments herein. Various steps in the design and composition of semiconductor devices are well known and so, in the interest of brevity, many conventional steps will only be mentioned briefly herein or will be omitted entirely without providing the well-known process details. Further, it is noted that semiconductor devices include a varying number of components and that single components shown in the illustrations may be representative of multiple components. Also, while planar devices are illustrated, the methods and semiconductor devices are applicable to finFET devices.

Turning now to FIG. 1, an exemplary process of fabricating a semiconductor device 10 begins by providing a semiconductor substrate 12 on which shallow trench isolation (STI) structures, source/drain regions, source/drain extension regions, gate dielectrics, contacts, spacers, hard mask layers, and other features may be formed. The semiconductor substrate 12 is typically a silicon wafer and includes various doping configurations as is known in the art to define a P-channel field effect transistor (PFET) region 16 and an N-channel FET (NFET) region 18. The semiconductor substrate 12 may also include other elementary semiconductor materials such as germanium. Alternatively, the substrate 12 may include a compound semiconductor such as, silicon carbide, gallium arsenide, indium arsenide, indium antimonide, or indium phosphide. Further, the substrate 12 may optionally include an epitaxial layer (epi layer), may be strained for performance enhancement, and/or may include a silicon-on-insulator (SOI) structure. As shown, a temporary gate oxide layer 20 is deposited on the semiconductor substrate 12. Further, a temporary polysilicon layer 22 and a temporary capping layer 24, such as silicon nitride, are deposited over the temporary gate oxide layer 20. In certain embodiments, a hard mask layer, such as a thin layer, e.g., about 3 nanometers, of silicon oxide, hafnium oxide or aluminum oxide, is positioned on the temporary polysilicon layer 22, i.e., between the temporary polysilicon layer 22 and the temporary capping layer 24. The layers 20, 22 and 24 (and any additional layers, such as the optional hard mask layer) are etched, such as by reactive ion etching (RIE) to form a PFET temporary gate structure 30, an NFET temporary gate structure 32, and, optionally, a transition temporary gate structure 34.

After formation of the gate structures 30, 32, 34; a layer 38 is deposited over the structures 30, 32, 34 and semiconductor substrate 12 as shown in FIG. 2. In certain embodiments, the layer 38 may be the same material as the capping layer 24. In FIG. 3, a mask 40 is formed over the NFET region 18 through typical photolithographic processes. In the PFET region 16, the layer 38 is etched, such as by RIE, to form a PFET spacer 44. During this etch process, some erosion of the layer 38 thickness can occur, including possibly some erosion of the capping layer 24 thickness as well, which would result in variation of the final gate structure height, were it not for the steps taken below to overcome that variation. As shown in FIG. 3, the portion of layer 38 overlying the capping layer 24, and a portion of the capping layer 24, have been eroded as a result of the etch process.

Figure 4:
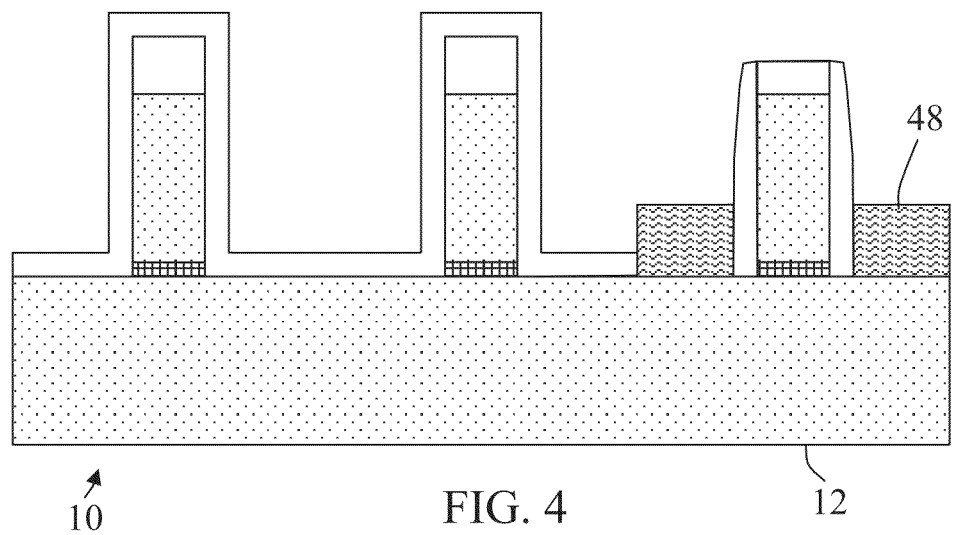
Figure 5:
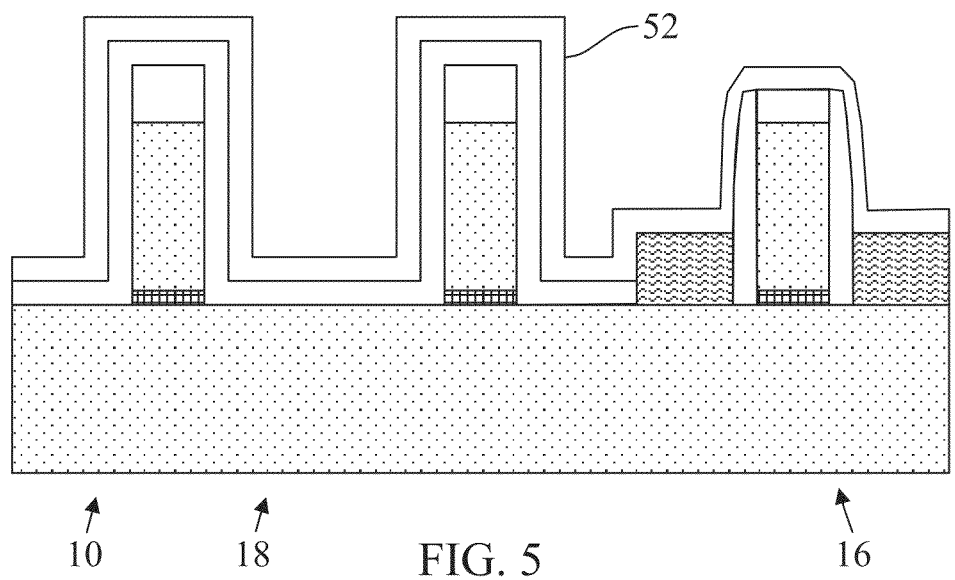
Figure 6:
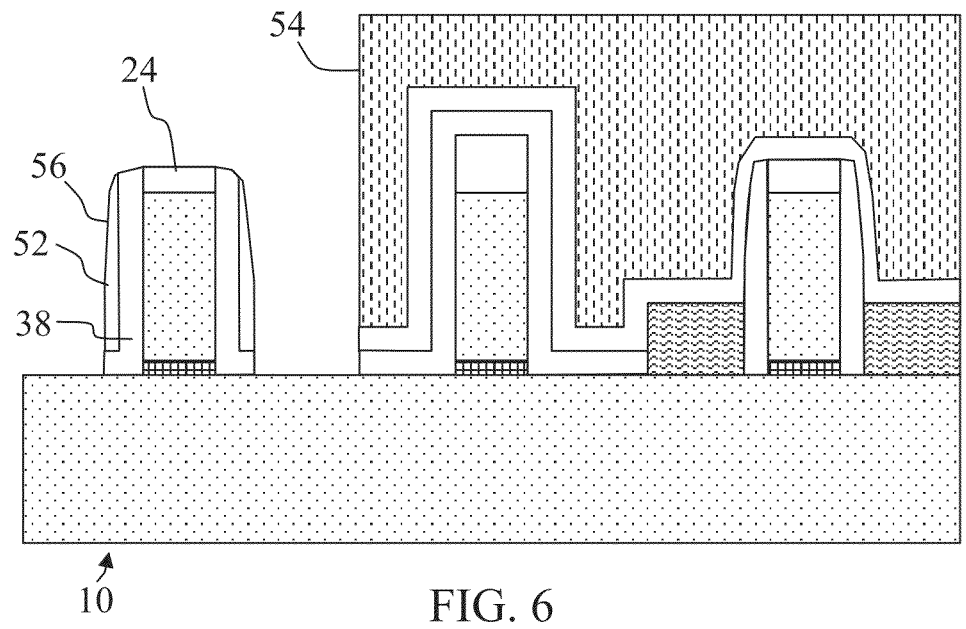

In accordance with one embodiment, as illustrated in FIG. 4, the mask 40 is removed and PFET active areas 48 are formed by growing material such as silicon or a silicon containing material like SiGe over the substrate 12 via a selective epitaxial process. The epitaxial material 48 may be doped or undoped. After formation of the PFET active areas 48, a layer 52 is deposited over the PFET and NFET regions 16, 18, as shown in FIG. 5. The layer 52 is typically the same material as layer 38, such as silicon nitride. A mask 54 is then formed over the PFET region 16 through typical photolithographic process steps as shown in FIG. 6. The layers 38, 52 are then etched, such as by RIE, to form the NFET spacer 56. During this etch process, some erosion of the thickness of layers 38 and 52 can occur, including possibly some erosion of the cap layer 24 thickness as well, which would result in variation of the final gate structure height, were it not for the steps taken below to overcome that variation. As shown in FIG. 6, the portion of layer 38 overlying the capping layer 24, and a portion of the capping layer 24, have been eroded as a result of the etch process.

Figure 7:
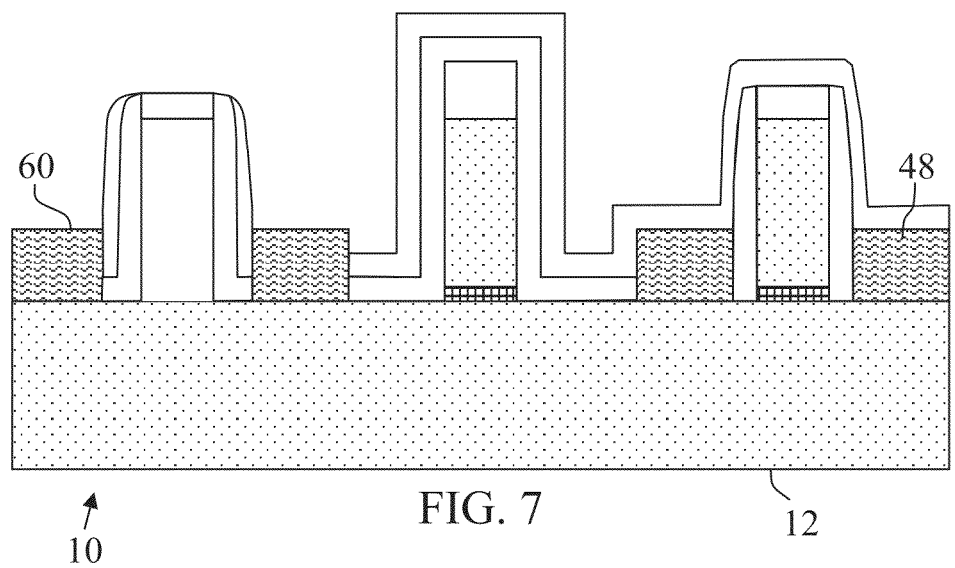
Figure 8:
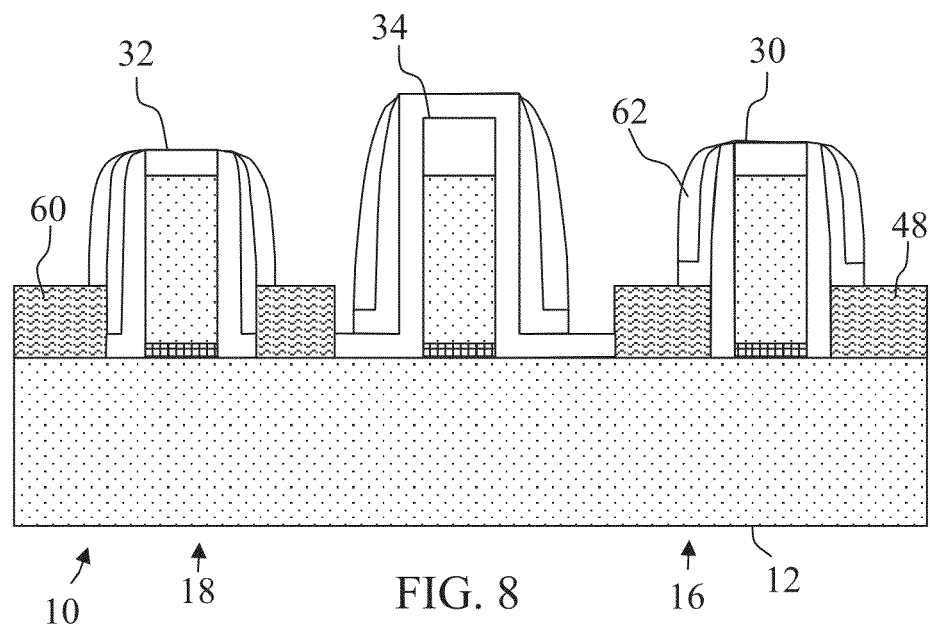

In FIG. 7, mask 54 is removed and NFET active areas 60 are formed over substrate 12, such as by growing a material such as silicon or a silicon containing material like Si:C via a selective epitaxial process. The epitaxial material 60 may be doped or undoped. For use of undoped or not sufficiently doped material in active areas 48, 60, a spacer layer 62, such as silicon nitride (SiN), is deposited and etched sequentially to form spacers around gate structures 30, 32, 34, as shown in FIG. 8. During this process, ion implantation processes are sequentially performed for each region 16, 18 to provide sufficient doping to the active areas 48, 60. Alternatively, the spacer layer 62 can also be oxide, which can be removed after ion implantation is done. These processes are common in modern processing and thus need not be described in detail here. These steps may be eliminated when the active areas 48, 60 are formed with sufficiently doped epitaxial material.

Figure 9:
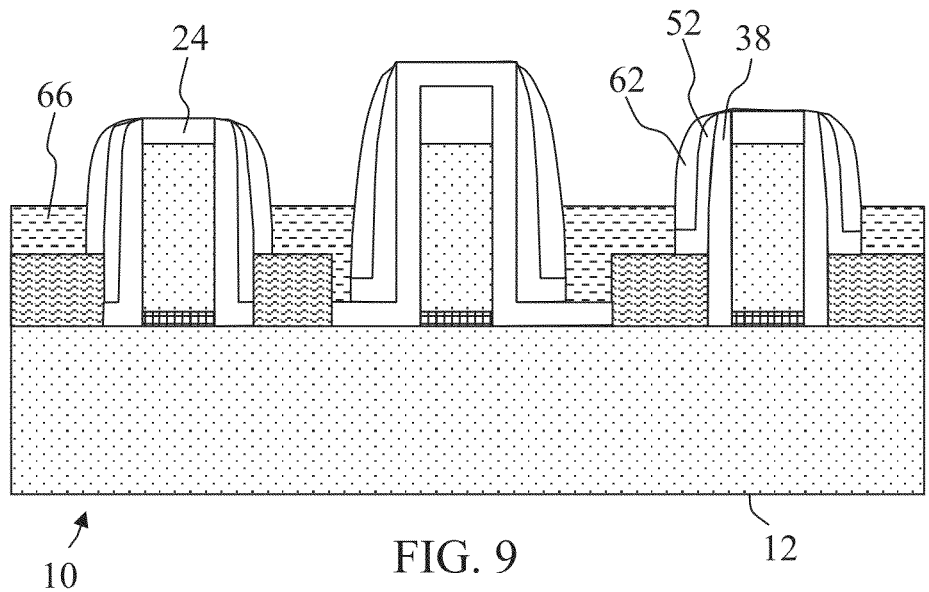
Figure 10:
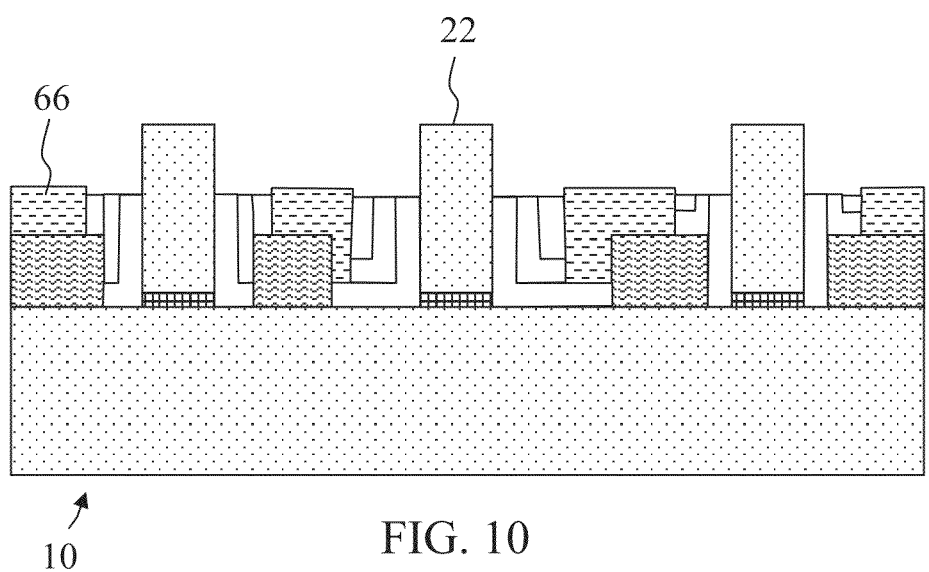

In FIG. 9, an insulator layer 66 is deposited over the semiconductor substrate 12 and etched as shown. This can be done by first over-filling the space using oxide, planarizing the oxide by chemical mechanical planarization (CMP), and recessing the oxide back via an appropriate directional etch or wet etch. Then, caps 24 and portions of layers 38, 52, 62 are removed to expose the temporary polysilicon gates 22, as in FIG. 10. In embodiments which include the optional hard mask layer positioned on the polysilicon gates 22, the hark mask layer will remain covering the polysilicon gates 22 after removal of the caps 24 and portions of layers 38, 52, 62. In cases where the spacer and cap material is SiN, the etch can be performed by an isotropic SiN dry etching process or a wet etch process using phosphoric acid. Because the layers inducing thickness variation have been removed, the gate structure no longer is subject to that variation, as is evident in FIG. 10.

Figure 11:
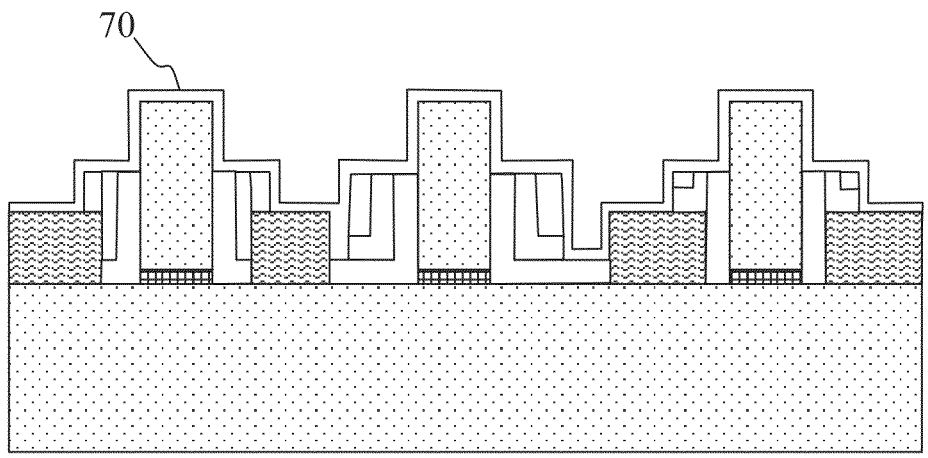
Figure 12:
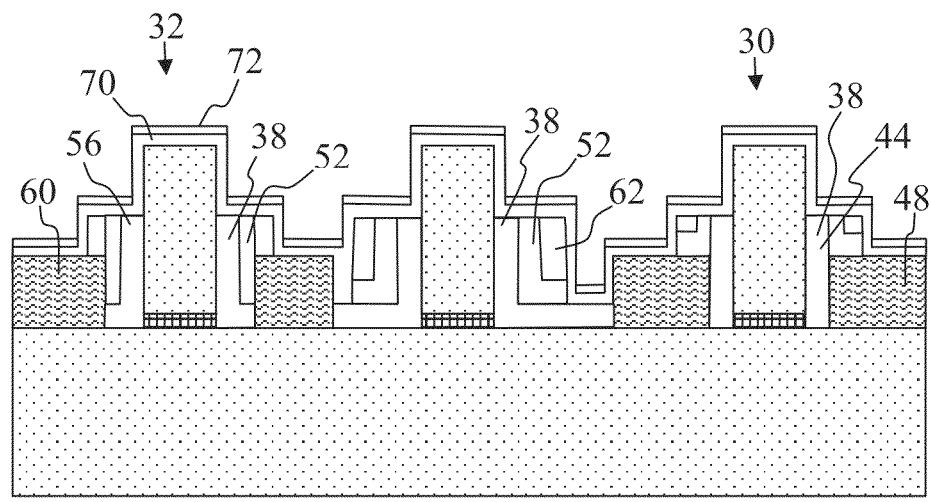

FIG. 11 illustrates an exemplary method in which the insulator layer 66 is removed before a uniform liner 70, such as silicon nitride, is deposited by a conformal process like atomic layer deposition (ALD). Alternatively, the insulator layer 66 may remain and the uniform liner 70 may be deposited over insulator layer 66. In an exemplary embodiment, the thickness of the uniform liner 70 is about 3 nanometers (nm) to about 8 nm, and the uniform liner is silicon nitride having a K value of about 7. FIG. 12 depicts an optional step in which an additional liner 72 is formed on the top surfaces of the uniform liner 70. For example, a directional dielectric deposition process using gas cluster ion beam deposition (GCIB) may be used to directionally form the additional liner 72. It is evident in FIG. 12 that the spacing between the PFET and NFET polysilicon gate structures, 30 and 32, and their respective epitaxial materials, 48 and 60, is established by the spacers 44 (formed by layer 38) and 56 (formed by layers 38 and 52), and not by the thickness of the vertical portions of uniform liner 70. Additionally, it is the dielectric constant (K value) of the uniform liner 70 and of subsequently deposited materials, and not the K value of spacers 44 and 56, which will most influence the capacitance between the final gate structure and the contact plugs.

Figure 13:
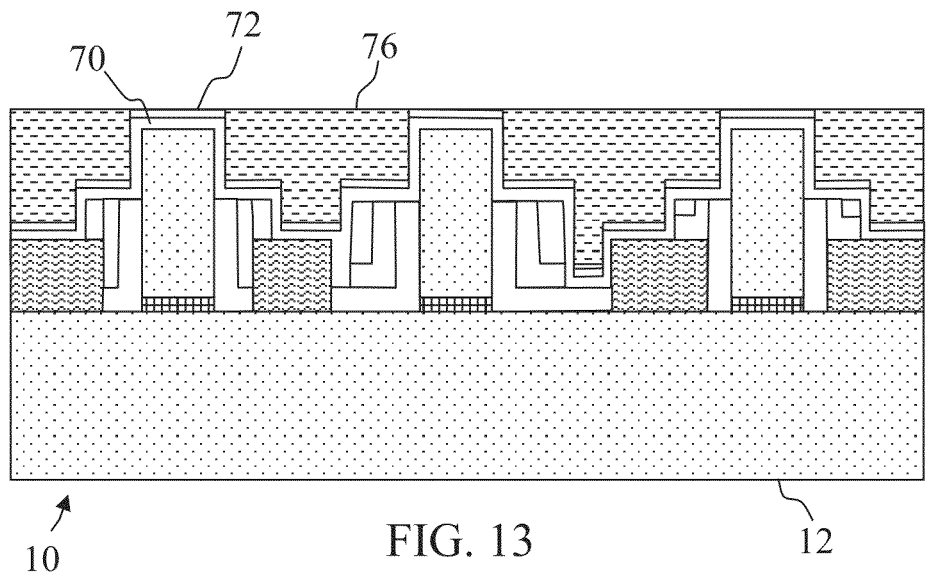
Figure 14:
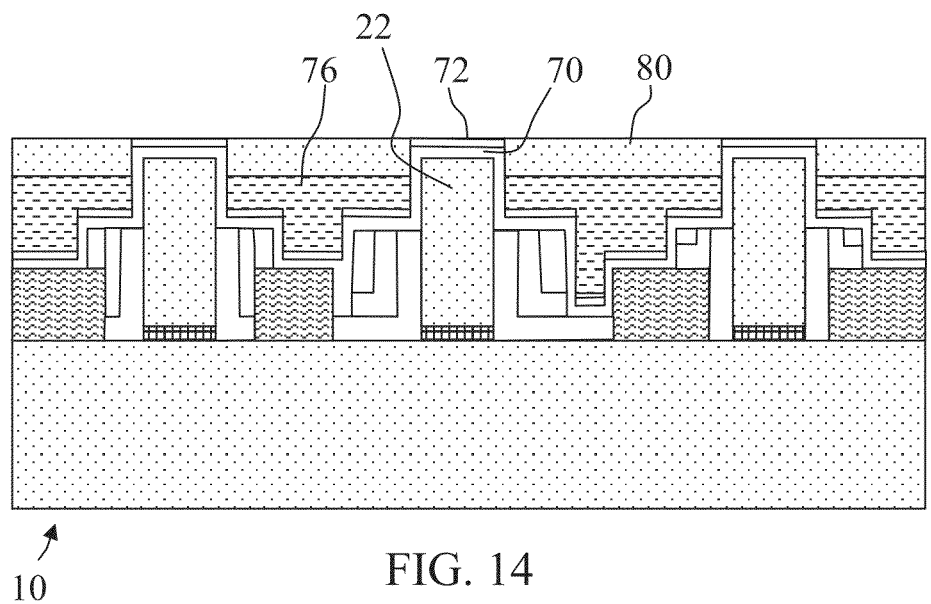

In FIG. 13, an insulator layer 76, such as flowable silicon oxide ($SiO_2$), is deposited over the semiconductor substrate 12 and planarized to the liner 72 (or to liner 70 if optional liner 72 is not utilized). An exemplary insulator layer 76 has a K value of about 5.5 or below. An exemplary planarization process uses a CMP process. Then, optionally, the insulator layer 76 can be recessed below the level of the liner 72 (or 70) as shown in FIG. 14. Thereafter, an insulator layer 80 is deposited over the layer 76 and is also planarized to the liner 72 (or 70). In an exemplary embodiment, the insulator layer 80 is an oxide deposited by high density plasma (HDP) deposition. An exemplary insulator layer 80 has a K value of about 3.9.

Figure 15:
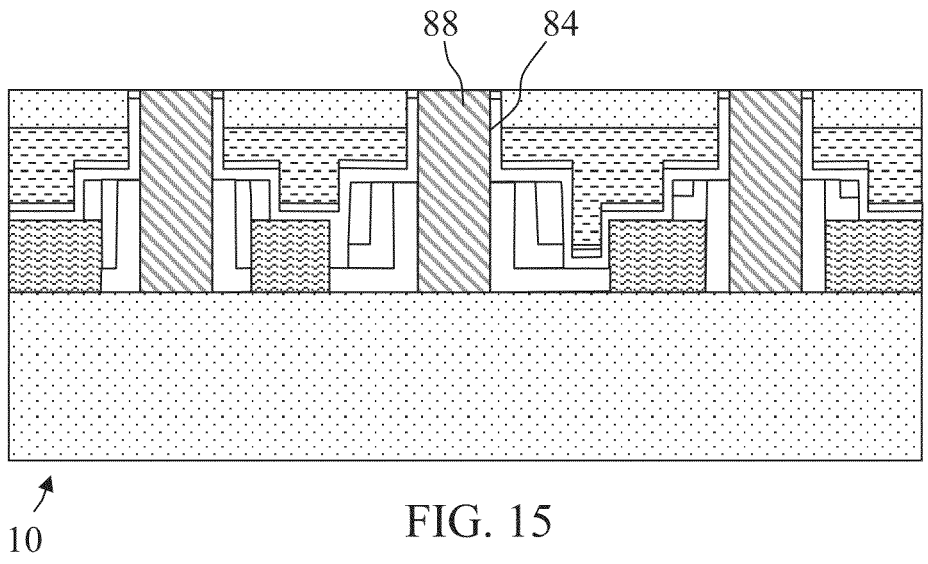
Figure 16:
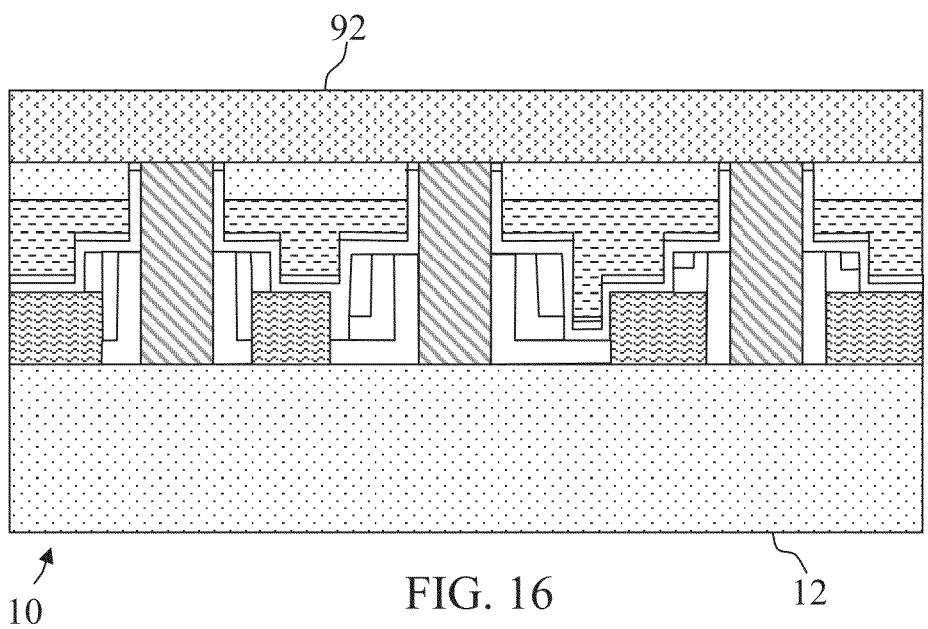
Figure 17:
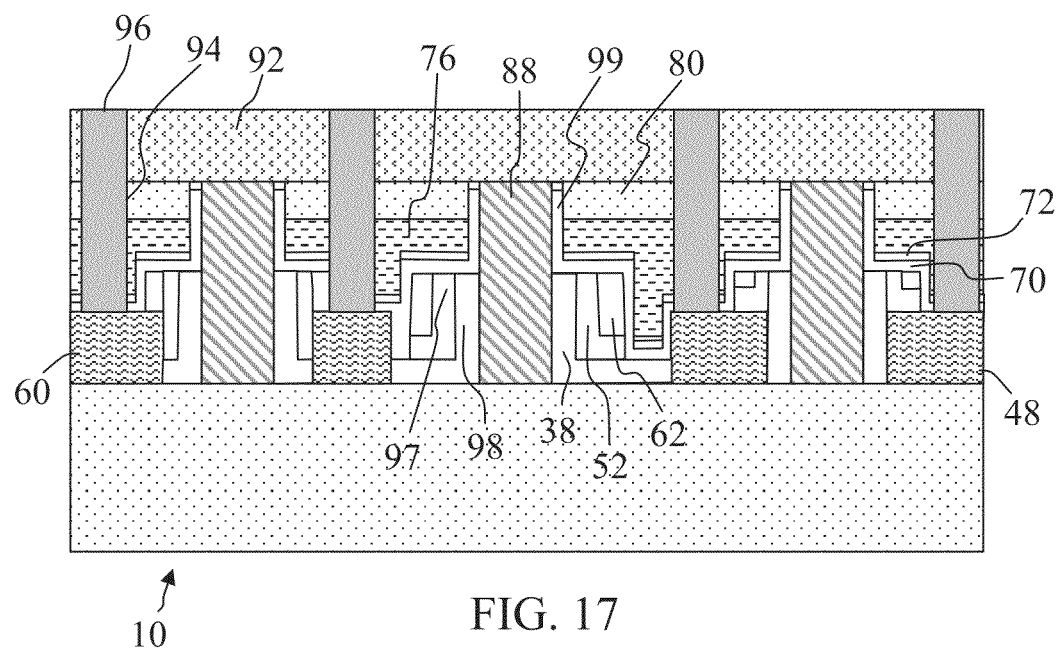

In FIG. 15, the portions of liners 70, 72 located over the polysilicon gates 22 are etched by, for example, RIE. After etching those portions of the liners, the polysilicon gates 22 are etched from the semiconductor device 10, thereby forming gate trenches 84. In embodiments in which the optional hard mask layer remains overlying the polysilicon gates 22, the hard mask layer is removed before the polysilicon gates 22 are etched to form the gate trenches 84. Replacement metal gate structures 88 are formed in the gate trenches 84 through typical deposition, etching, and planarization steps. A high-k dielectric material, such as hafnium dioxide, is deposited into the gate trenches 84 beneath the metal gate. In FIG. 16, an interlayer dielectric material 92 is deposited over the semiconductor substrate 12. Via trenches 94 are then formed through the interlayer dielectric material 92, insulators 76 and 80, and liners 72 and 70 to the active areas 48 and 60 as illustrated in FIG. 17. Then a metal is deposited into the via trenches 94 to form contact plugs 96 creating electrical connections to the active areas 48, 60 as desired. An optional silicide process can be done right after FIG. 8 or through the via trench 94 at the step described in FIG. 17, before metal fill is performed.

As shown in FIG. 17, the semiconductor device 10 is formed with replacement metal gate structures 88 surrounded by spacers 97 having lower portions 98 and upper portions 99. While the upper portions 99 are formed only from the uniform liner 70, the lower portions 98 are formed from layers 38, 52, 62. As a result, the thicknesses of the lower portions 98 are greater than the thicknesses of the upper portions 99. For example, the lower portions may have a thickness of about 10 nm to about 20 nm and the upper portions may have a thickness of about 3 nm to about 8 nm. Further, unlike conventional gate structure processing, no stress liner is applied in the methods herein, rather a normal oxide film with a K value of 3.9 or a lower-k dielectric material is used. In various embodiments, the method may continue and include process steps such as deposition or formation of additional layers, additional contacts and interconnect structures (e.g., lines and vias, metal layers, and interlayer dielectric material to provide electrical interconnection to the device including the formed metal gate structures 88.

In summary, a semiconductor device fabrication process is implemented to form metal gate structures with improved height uniformity. Specifically, the process removes gate caps, liners, and spacers from temporary gate structures. The caps, liners and spacers have endured various etching processes that result in non-uniform thicknesses. After the non-uniform caps, liners, and spacers are removed, a uniform liner is formed on the temporary gate structures and is used as a planarization stop before the formation of replacement metal gate structures. The uniform planarization stop provides for height uniformity for the replacement metal gate structures. Further, parasitic capacitance is reduced, thereby improving device performance.

The fabrication methods described herein result in semiconductor devices having metal gate structures with improved height uniformity. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating a semiconductor device comprising:
   forming over a semiconductor surface a temporary gate structure including a gate and a cap;
   forming a spacer around the gate;
   removing the cap and a portion of the spacer to define an exposed surface of the gate;
   depositing a first insulator over the uniform liner;
   depositing a uniform liner on the exposed surface of the gate;
   removing a portion of the uniform liner overlying the gate and the gate to form a gate trench;
   planarizing the first insulator to the uniform liner before removing the portion of the uniform liner and the gate to form the gate trench;
   recessing the planarized first insulator;
   depositing a second insulator over the recessed first insulator;
   planarizing the second insulator to the uniform layer; and
   forming a replacement metal gate in the gate trench.

2. The method of claim 1 further comprising:
   forming active areas adjacent the spacer;
   depositing an insulator over the uniform liner;
   depositing an interlayer dielectric material over the replacement metal gate and the insulator;
   etching vias through the interlayer dielectric material, the insulator, and the liner to expose the active areas; and
   filling the vias with metal to form contacts with the active areas.

3. The method of claim 2 wherein depositing the insulator comprises depositing a material having a K value of no more than about 5.5 over the uniform liner.

4. The method of claim 1 wherein removing the cap and the portion of the spacer comprises:
   depositing a gap fill material over the semiconductor substrate;
   planarizing the gap fill material;
   etching back the gap fill material to expose the cap and the portion of the spacer; and
   etching the cap and the exposed portion of the spacer.

5. The method of claim 1 wherein forming the replacement metal gate in the gate trench comprises positioning a lower portion of the replacement metal gate between spacer portions having a first thickness and positioning an upper portion of the replacement metal gate between uniform liner portions having a second thickness less than the first thickness.

6. The method of claim 1 wherein depositing the uniform liner comprises depositing a uniform layer of nitride overlying the gate, and wherein the method further comprises directionally depositing an additional layer of nitride over the uniform layer of nitride.

7. A method for fabricating a semiconductor device comprising:
   forming over a semiconductor surface a temporary gate structure including a gate and a cap;

forming a spacer around the gate;
removing the cap and a portion of the spacer and defining exposed portions of side surfaces of the gate;
after removing the cap and the portion of the spacer, depositing a uniform liner overlying the gate and on the exposed portions of the side surfaces of the gate;
removing a portion of the uniform liner overlying the gate and the gate to form a gate trench; and
forming a replacement metal gate in the gate trench.

8. The method of claim 7 further comprising:
depositing a first insulator over the uniform liner;
planarizing the first insulator to the uniform liner before removing the portion of the uniform liner and the gate to form the gate trench;
recessing the planarized first insulator;
depositing a second insulator over the recessed first insulator; and
planarizing the second insulator to the uniform layer.

9. The method of claim 7 wherein removing the cap and the portion of the spacer comprises:
depositing a gap fill material over the semiconductor substrate;
planarizing the gap fill material;
etching back the gap fill material to expose the cap and the portion of the spacer; and
etching the cap and the exposed portion of the spacer.

10. The method of claim 7 wherein:
removing the cap and the portion of the spacer comprises defining an exposed upper surface of the gate; and
depositing the uniform liner comprises depositing the uniform liner on the exposed upper surface of the gate.

11. A method for fabricating semiconductor devices comprising:
forming temporary gates over a semiconductor surface;
forming at least one temporary material adjacent and overlying the temporary gates;
depositing a gap fill material over the semiconductor surface;
planarizing the gap fill material before etching back the gap fill material to expose a portion of the at least one temporary material;
removing the gap fill material after removing the exposed portion of the at least one temporary material;
depositing a uniform liner overlying the temporary gates;
depositing an insulator material over the uniform liner;
planarizing the insulator material to the uniform liner and exposing portions of the uniform liner overlying the temporary gates;
removing the portions of uniform liner overlying the temporary gates and the temporary gates to form gate trenches; and
forming replacement metal gates in the gate trenches.

12. The method of claim 11 further comprising: forming active areas around the temporary gates.

13. The method of claim 12 wherein forming temporary gates comprises forming an NFET temporary gate structure on an NFET region of the semiconductor surface and forming a PFET temporary gate structure on a PFET region of the semiconductor surface; and wherein forming active areas comprises forming NFET active areas and PFET active areas.

14. The method of claim 13 wherein forming PFET active areas comprises:
depositing a PFET spacer layer over the temporary gates and the semiconductor surface;
forming an NFET mask over the NFET region;
etching the PFET spacer layer in the PFET region to form a first PFET spacer adjacent the PFET temporary gate;
removing the NFET mask; and
epitaxially growing material adjacent the first PFET spacer.

15. The method of claim 12 wherein depositing the uniform layer comprises depositing a uniform layer of nitride overlying the temporary gates and active areas by atomic layer deposition to a thickness of about 3 nm to about 8 nm.

16. The method of claim 12 wherein depositing the uniform liner comprises depositing a uniform layer of nitride overlying the temporary gates and active areas, and wherein the method further comprises directionally depositing an additional layer of nitride over the uniform layer of nitride.

17. The method of claim 12 wherein depositing the uniform layer comprises depositing a uniform nitride layer having a K value of about 7 overlying the temporary gates and active areas, and wherein depositing the insulator material comprises depositing oxide having a K value of no more than about 5.5 over the uniform liner.

* * * * *